United States Patent
Lust et al.

(10) Patent No.: US 8,562,196 B2
(45) Date of Patent: Oct. 22, 2013

(54) DISPLAY AND/OR CONTROL ELEMENT IN A MOTOR VEHICLE

(75) Inventors: Matthias Lust, Bad Neustadt (DE); Martin Jeitner, Ostheim (DE); Wolfgang Kuechler, Ostheim (DE); Dieter Schroeder, Wuelfershausen (DE)

(73) Assignee: Preh GmbH (DE)

( * ) Notice: Subject to any disclaimer, the term of this patent is extended or adjusted under 35 U.S.C. 154(b) by 1127 days.

(21) Appl. No.: 12/441,871

(22) PCT Filed: Sep. 20, 2007

(86) PCT No.: PCT/EP2007/008174
§ 371 (c)(1), (2), (4) Date: Jul. 21, 2009

(87) PCT Pub. No.: WO2008/034610
PCT Pub. Date: Mar. 27, 2008

(65) Prior Publication Data
US 2012/0145523 A1     Jun. 14, 2012

(30) Foreign Application Priority Data

Sep. 22, 2006   (DE) .......................... 10 2006 045 335

(51) Int. Cl.
*G01D 11/28*  (2006.01)
(52) U.S. Cl.
USPC ...................................... 362/600; 362/23.05
(58) Field of Classification Search
USPC ..................................................... 362/23, 29
See application file for complete search history.

(56) References Cited

FOREIGN PATENT DOCUMENTS

| DE | 196 30 734 A1 | 2/1997 |
| DE | 102 08 674 A1 | 9/2003 |
| DE | 103 37 456 A1 | 6/2004 |
| DE | 10 2005 006 459 A1 | 8/2006 |
| DE | 10 2005 032 717 B3 | 8/2006 |
| DE | 10 2007 029 314 A1 | 3/2008 |
| EP | 1 217 491 A1 | 6/2002 |

OTHER PUBLICATIONS

English Translation of DE102005032717, published Aug. 31, 2006.*
English Translation of EP1217491, published Jun. 26, 2002.*

* cited by examiner

*Primary Examiner* — Mary Ellen Bowman
(74) *Attorney, Agent, or Firm* — Cantor Colburn LLP

(57) ABSTRACT

The invention relates to a cap (1) for a display and/or control element. Said cap (1) comprises a cap member (3) for covering a light source (7) and optionally also actuating a switch of an associated control element. A luminous area or projection area is embodied in the cap member (3) in such a way that a symbol represented on or through the luminous area or projection area becomes visible on an operator's side of the display and/or control element by irradiating the symbol by means of a light source (7). The luminous area or projection area encompasses a light-permeable metal coating (2) which is preferably applied using a PVD process. The cap is characterized in that the metal coating (2) has a three-dimensional contour (2*a*, 2*b*) for representing the symbol. The invention further relates to an associated production method, a display or control element comprising said cap, and a use.

15 Claims, 1 Drawing Sheet

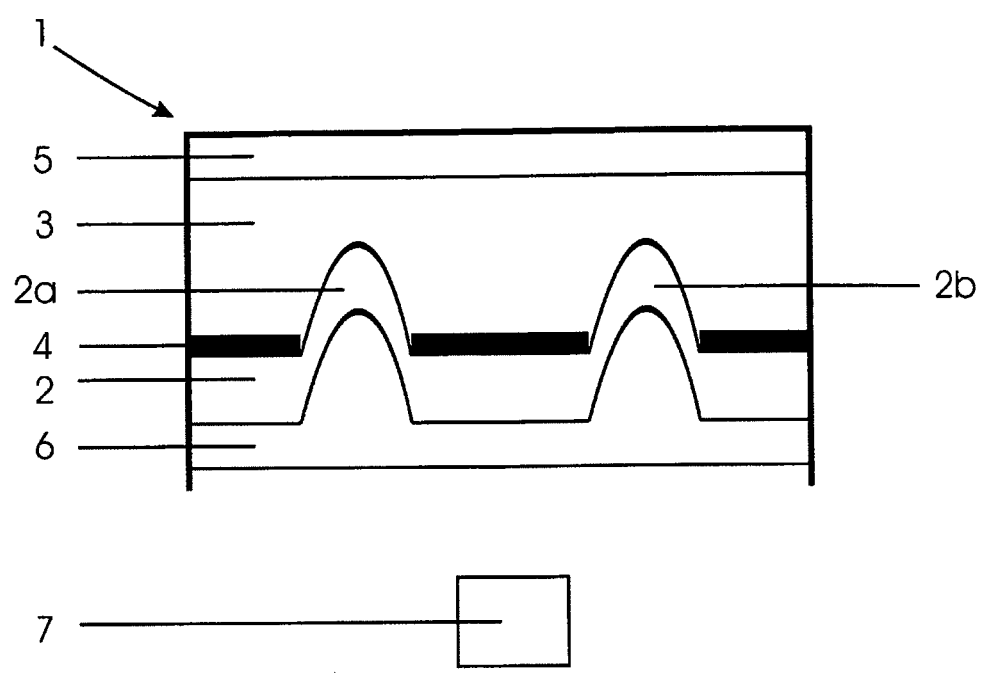

DISPLAY AND/OR CONTROL ELEMENT IN A MOTOR VEHICLE

The invention concerns a cap for a display or control element, in particular a button, for example for use in a motor vehicle. The cap has a cap member and, located in the cap member, a luminous area or projection area, which, when the cap is used and arranged as intended as part of a display or control element, is visible to the operator on account of a light source located under the cap. The luminous or projection area serves in general to represent a backlighted symbol that, for example, informs the operator of which device can be operated with the control element, for example the air conditioner in a motor vehicle. Furthermore, the luminous area or projection area can serve to provide information on the switching state of the control element or the switching state of the devices connected to the control element, or it can serve to provide information on states of the devices standing in association with the display or control element in order to indicate conditions such as a problem with the device connected to the display or control element.

It is known from DE 10 2005 006 459 A1 to provide a display element made of a transparent or translucent plastic with a metal coating in part of its area by means of an adhesion promoting layer, wherein the adhesion promoting layer, which has been applied by means of PVD coating (PVD=Physical Vapor Deposition) for example, has been partially removed by laser, in order to create a symbol with backlighting. The metal coating is opaque.

DE 102 08 674 A1 also describes a method for producing a control, decorative, or display element that is coated on the front—and, moreover, galvanically coated—wherein a transparent or translucent plastic member is provided with a metal layer that is partially removed in order to create the symbol. The metal layer is not backlighted. Moreover, both methods are comparatively costly. Furthermore, the metal layer facing the observer or operator poses the problem that it is comparatively sensitive to cleaning agents and perspiration, so that the recommendation is generally made to provide an additional protective lacquer or varnish. In addition, in control or display caps produced in this way, the symbol is generally quite visible even in daylight, in particular in direct sunlight, so that under this illumination the operator cannot discern whether the symbol is actually illuminated or not, which is to say, for example, whether or not the device connected to the control element is turned on or whether or not a problem is present, for example. Moreover, this problem is exacerbated when the observer is not located directly in front of the luminous area or projection area, but instead is located offset to one side. Since the difference between illumination for identification and for function in the display area thus is not easily recognizable under all possible lighting conditions and, in particular, viewing angles, the conveying of information is not reliable, since incorrect information cannot be avoided under all lighting conditions. For motor vehicles, not only is this problematic for reasons of safety, but it also hinders the monitoring of display and control elements by a passenger. For example, the passenger should also be able to easily recognize the control and display elements for heating and climate control.

In addition, a symbol that still remains visible on the luminous or projection area even when the control element's light source is shut off generally has the disadvantage that the operator is bombarded with information that is not relevant at the moment. In order to avoid this, aside from the esthetically advantageous effect, a symbol that is as unobtrusive as possible on the luminous or projection area, which is to say that does not appear, when the light source is shut off, is desirable.

From DE 103 37 456 A1 is known a component with a partially light-transmissive metal coating for producing an optical effect. However, this is not a backlighted control or display element.

Known from the present applicant's unpublished application DE 10 2007 029 314.5 is a cap for a display or control element with light-transmissive metal coating in which the metal coating is applied to a transparent or translucent paint layer, wherein said paint layer is provided for the purpose of imparting a smooth surface for the metal coating. However, surprisingly to the inventor, it became apparent that it is still possible to considerably improve the identifiability of the symbol when viewed from the side, which is to say at a viewing direction that is at an angle to the perpendicular viewing direction.

It is thus the object of the present invention to provide a cap for a control element or an associated control element in which the presentation of the symbol reproduced on the luminous or projection area is improved, particularly when viewed from the side, and which is also inexpensive to produce and durable. This object is attained by a cap according to claim 1, or by a display and/or control element according to claim 10 or claim 11. An associated production method and an advantageous use are the subject matter of the coordinated claims. The dependent claims each concern advantageous embodiments.

The inventive cap is intended for a display or control element and is intended for covering a pure display element with a light source, for example, or additionally serves to cover and actuate a switch of an associated control element that is combined with a display device.

Thus, the cap forms the associated control element, for example together with at least the switch. The cap is integrated into a control or display panel or an instrument panel of a motor vehicle, for instance. For example, the associated switch is a pushbutton switch, rotary switch, etc.

According to the invention, a luminous or projection area is provided in the cap and is designed such that when illuminated by a light source, for example an LED, located on the switch or inner side, a symbol represented on the luminous or projection area, for example a character, word or symbol, becomes visible to a viewer or operator of the display or control element, for example the driver. The luminous or projection area of the inventive cap includes a light-transmissive, which thus also means partially light-transmissive, metal coating. The degree of light transmissivity and the light source provided on the inside of the cap, or its light intensity and/or spectrum, are chosen such that, although the comparatively intense light of the light source is allowed to pass, and the viewer can thus easily recognize the illuminated symbol, the reflectivity of the metal coating ensures adequate reflection of the ambient light. The latter property has the result that the luminous or projection area and its symbol are almost utterly invisible (mirrored sunglass effect) when the light source is switched off. According to the invention, the metal coating ensures that the difference between the illuminated and non-illuminated symbol is especially discernable even with high ambient light intensity. Since the operator or viewer can reliably recognize this difference, inaccurate information can advantageously be avoided.

According to the invention, the cap is distinguished in that the metal coating has a three-dimensional contour for representing the symbol. This means that the metal coating has a profile in cross-section that is not restricted to an essentially flat extension of the metal coating, but instead rises or falls perpendicular to the surface of the cap facing the operator, wherein reflection or luminous areas standing at an angle to the aforementioned surface of the cap are produced which ensure that the aforementioned effects of the metal coating occur even when the luminous area is viewed from the side, which is to say from a position offset from a central and perpendicular position, and the symbol is particularly recognizable, and in particular from the side as well. It must thus be counted to the credit of the inventor, firstly to have recognized that the effects of the metal coating when viewed from the side require improvement, and secondly to have made the surprising determination that this improvement can be achieved in a comparatively simple and inexpensive manner through the inventive contouring of the metal coating.

The metal coating is preferably deposited by means of a PVD (physical vapor deposition) method. In the PVD method, a fundamental distinction is made between two methods. First, there is the more economical method of evaporation, in which metals that evaporate at low temperature are evaporated by the addition of thermal energy and are thus deposited on the surface of the button element. This method is used when vapor depositing aluminum or copper, for example. Alternatively, the sputtering of substrate material, for example stainless steel, is employed with the aid of an ionized process gas. In this process, a process gas (generally argon) is ionized and is accelerated by means of magnetic field assistance onto the material to be deposited, in this case the target (magnetron sputtering). Through momentum transfer of the ionized gas atoms, atoms and atom clusters are ejected from the target in the vacuum, and deposit themselves at the desired location on the surface of the cap member. Such methods are described in DE 103 37 456 A1, whose disclosure content is incorporated herein by reference.

If necessary, a pretreatment or activation of the surface to be coated can be performed to increase adhesion strength. This adhesion improvement may be necessary, for example, when the metal coating is applied to the surface of the cap member facing the operator, and this surface will be regularly touched by the operator, for example to actuate the associated switch, or will be in frequent contact with relatively aggressive cleaning fluids. The surface to be coated is pretreated or activated using these special methods for treating surfaces, for example wet chemical surface pretreatment methods such as etching and physical surface pretreatment methods such as flame treatment (pyrolysis), fluorination, corona treatment and plasma methods. The polarity or surface energy of the surface is increased by the process of activation, by which means an improved adhesion or improved wettability is achieved.

In another advantageous embodiment, the three-dimensional contour of the metal coating is achieved through coating of an appropriately shaped surface of the cap member in the region of the luminous or projection area. By this means, the aforementioned improvement in lateral discernability can be achieved in a relatively simple and inexpensive manner.

According to another advantageous embodiment, the symbol can be defined by a mask consisting of an opaque layer, for example of paint or plastic. The mask is a screen with a light transmission opening whose shape corresponds to the outline of the symbol to be represented. The inventive cap can be produced in an especially inexpensive manner with a mask. The arrangement of the mask defining the luminous symbol directly around the luminous area achieves an especially sharply contoured representation of the symbol. For example, the mask is created by means of an opaque paint layer that is removed in sections, for example by laser processing. The inventive cap can be produced in an especially inexpensive manner by this means. Moreover, any desired symbol can be represented on the cap on account of the especially flexible options for processing by the laser. In another embodiment, the cap member is made of a translucent or transparent plastic, and the mask is made from an opaque plastic, in a multi-component injection molding method. In another example embodiment, the mask is specifically deposited at the desired places by printing. The mask can be a partially opaque film that is deposited on the transparent cap member, for example glued or in-mold laminated and fused.

Another advantageous embodiment is distinguished in that the three-dimensional contour of the metal coating has a profile that, at least in part, is raised in the direction of the surface of the cap facing the operator from the plane defined by the mask. For example, the metal coating in the region of the light-transmissive section left clear by the mask rises in peaks in the direction of the observer so as to result in a three-dimensional representation of the symbol in this region, wherein the edges of the metal coating standing at an angle to this plane or to the surface of the cap ensure increased visibility from the side, wherein at the same time the surrounding masking in the regions recessed relative thereto guarantees a high-contrast representation.

The metal coating is preferably not deposited on a surface of the cap member facing the operator or observer, but instead, for example, is deposited on the surface of the cap member facing the light source, at least in the region of the luminous or projection area, and thus is located in a place covered by the cap member. Since the metal coating thus cannot be touched by the operator, and also cannot come into contact with cleaning fluids, the metal coating is not at risk from abrasion, and no stringent requirements need be placed on its resistance to chemicals. Special surface treatment processes to increase adhesion can thus be advantageously eliminated.

In another advantageous embodiment, the metal coating preferably has a thickness of less than 5 µm, preferably in the range of 5 nm-50 nm. Surprisingly, it has been determined that such a range of 5 nm-50 nm in particular can provide sufficient reflection of ambient light together with sufficient transmissibility of the light from commonplace light sources such as LEDs that the "lighting" of the symbol in question is adequately discernible.

In an advantageous embodiment, the metal coating includes at least one metal layer chosen from at least one metal or metalloid such as Sc, Y, Ti, Zr, V, Nb, Ta, Cr, Mo, W, Mn, Fe, Co, Pd, Pt, Cu, Ag, Au, Zn, B, Al, In, Tl, Si, Ge, Sn, Pb, Sb, Bi, alloys or mixed layers thereof, and/or stainless steel. The different metals or multiple different metal layers can be provided in order to achieve different optical effects, for example colored reflection. Examples of this are also disclosed in DE 103 37 456 A1.

In an advantageous embodiment of the inventive cap, the cap member, at least in the region of the luminous or projection area, preferably the entire cap member, is designed to be transparent or translucent; moreover, the mask is located on the inner side of the cap facing the switch or light source and adjacent thereto, and the metal coating is deposited between the mask and the light source. As a result of this type of arrangement, the inventive cap can be produced relatively inexpensively. The cap member or the luminous or projection area can be colored to give the represented symbol a desired color. The color of the opaque paint layer here is preferably matched to the reflective effect of the metal layer located below it, so that under ambient illumination with the light source switched off, the unilluminated symbol and the region covered by the opaque paint layer can be selected for high contrast for good discernability of the symbol, or for low contrast so that the observer is not burdened with information that is not presently relevant.

The invention further relates to a control element that includes the above-described cap in the above-described embodiments and with the advantages described in each case. The control element is a rotary switch, for example. Preferably the control element is a pushbutton, and the control element cap is correspondingly a pushbutton cap.

The invention further relates to a display element that includes the above-described cap in the above-described embodiments and with the advantages described in each case. The aforementioned display or control element advantageously finds application in a motor vehicle, a household appliance, in particular what are known as white goods, or in an electronic entertainment device. Not least on account of the very widely varying lighting conditions, it preferably finds application in a motor vehicle, where it is integrated into an instrument panel or a display panel, for example.

The invention further relates to a method for producing a cap for a display and/or control element in one of the above-described embodiments. Here, in a first step the transparent or translucent cap member is produced from polycarbonate, for example Lexan®. Simultaneously or in another, separate step, the opaque layer forming a mask, which is deposited on the inner side of the cap member facing the light source and defines a luminous area, is produced. The inner side of the cap member, which is to say the side of the cap member facing the light source or the switch, thus remains sealed off in a light-tight manner except for the opening of the mask. In the region of the luminous area defined by the mask, the cap member here has a three-dimensional contour that is transferred in a further step to the metal coating, which is deposited by means of a PVD method at least onto the luminous area defined by the mask. In one or more further optional steps, the cap member is coated on the side facing the operator and/or on the side facing the light source with a transparent or translucent protective paint, which is also colored if applicable.

In another advantageous embodiment of the aforementioned inventive method, the cap member and the opaque layer are produced by a multicomponent injection molding method or by in-mold lamination of an opaque film in a common step, or alternatively the opaque layer is deposited on the cap member by printing in a step following the production of the cap member.

In the attached drawing, a preferred embodiment of the inventive control element cap is shown, without limiting the invention thereto, wherein FIG. 1 shows a schematic sectional side view of the inventive display or control element cap. Since the drawing is merely for illustrative purposes, the drawing is not true to scale.

FIG. 1 shows an inventive display or control element cap, which is labeled in general as 1. The cap 1 comprises a transparent and/or translucent cap member 3 of polycarbonate, for example Lexan®, which is produced by an injection-molding or deep-drawing process. An opaque plastic layer, plastic film, paint layer, or multicomponent injection molding is deposited on the inner side of the cap member 3 (the lower side of the cap member 3 in the FIGURE) facing the light source 7 or the switch. This opaque layer 4 has openings so as to form a mask whose openings define a symbol. The underside of the cap member 3 is not flat in the region of the openings in the opaque layer 4, but instead has a three-dimensional structure that rises toward the surface of the cap 1 facing the operator (the top in the FIGURE). A translucent metal coating 2 is deposited by means of a PVD method on the inner surface defined by the mask 4 or the cap member 3 in the region of the openings of the mask 4. As a result of the three-dimensional contour of the cap member 3 in the region of the openings in the mask 4, the metal coating 2 likewise has a corresponding three-dimensional contour, as is shown by the cross-sectional profiles 2a and 2b. At this point it is mentioned solely for purposes of clarification that relative sizes, in particular the thicknesses of the layers 2, 3, 4, 5, 6, are represented only schematically and in principle, since a translucent PVD layer 2 in particular is very thin, which is to say 10 nm to 200 nm thick, preferably 50 nm to 100 nm thick. This results in a luminous area that is not flat, but rather one whose surfaces angled relative to the upper side of the cap 1 ensure better discernability of this luminous area from the side.

A transparent or translucent protective paint 6 is optionally deposited on the full area of the metal coating 2 to protect the metal coating 2. The cap member 3 is optionally, which is to say including or excluding the side facing the operator, coated with a transparent, for example high gloss, possibly also colored, protective paint 5. In the installed state of the cap 1, a light source 7, for example an LED, is located under the cap 1. Light from this light source 7 passes through the translucent or transparent paint 6 and the light-transmissive metal coating 2, and causes the symbol to illuminate in the region of the openings in the mask 3 on account of the mask formed by the opaque layer 3.

This symbol is visible from the operator side through the transparent protective paint 5 and the translucent or transparent cap member 3. As a result of the three-dimensional contour 2a, 2b of the metal coating 2, the symbol appears not flat, but instead three-dimensional with the light source 7 switched on, and is thus easily discernible even at an oblique angle, where an oblique angle is understood to mean a direction of view of an occupant in the motor vehicle onto the control element 3 from a direction that is not perpendicular.

The invention claimed is:

1. A cap for a display and/or control element, the cap comprising:
   a cap member for covering a light source and/or for actuating a switch of an associated control element; and
   a luminous or projection area formed in the cap member and being configured such that a symbol represented on or through the luminous or projection area becomes visible on an operator side of the display and/or control element as a result of illumination by a light source,
   wherein the luminous or projection area includes a light-transmissive metal coating,
   wherein the metal coating has a three-dimensional contour for representing the symbol,
   wherein the three-dimensional contour of the metal coating is formed by coating a suitably designed surface of the cap member in a region of the luminous or projection area, the cap member having a three-dimensional structure that rises towards the operators side of the cap member,
   wherein the symbol is defined by a mask having an opaque layer.

2. The cap for a display and/or control element according to claim 1, wherein the three-dimensional contour of the metal coating has a profile that, at least in part, is raised in the direction of the surface of the cap facing the operator from the plane defined by the mask.

3. The cap for a display and/or control element according to claim 1, wherein the metal coating is deposited on the surface of the cap member facing the light source, at least in the region of the luminous or projection area.

4. The cap for a display and/or control element according to claim 1, wherein the metal coating has a thickness of less than 5 .mu.m, preferably in the range from 10 nm to 200 nm.

5. The cap for a display and/or control element according to claim 1, wherein the metal coating is at least one metal layer chosen with at least one metal or metalloid such as Sc, Y, Ti, Zr, V, Nb, Ta, Cr, Mo, W, Mn, Fe, Co, Pd, Pt, Cu, Ag, Au, Zn, B, Al, In, Ti, Si, Ge, Sn, Pb, Sb, Bi, alloys or mixed layers thereof, and/or stainless steel.

6. Cap for a display and/or control element according to claim 1, wherein the cap member, at least in the region of the luminous or projection area is designed to be transparent or translucent and in that the mask is located in the cap member or on the inner side of the cap member facing the switch or light source and adjacent thereto.

7. The cap for a display and/or control element according to claim 1, wherein a transparent or translucent protective paint layer is deposited on the metal coating.

8. A display and/or control element, characterized by a control element cap according to claim 1.

9. A control element according to claim 8, wherein the control element is a pushbutton and the control element cap is a pushbutton cap.

10. A method for producing a cap for a display and/or control element according to claim 1, wherein in a first step the transparent or translucent cap 1 member is produced from polycarbonate, and simultaneously or in a separate step, the opaque layer forming a mask, which is deposited on the inner side of the cap member facing the light source and defines a luminous area, is produced, wherein the cap member in the region of the luminous area defined by the mask has a three-dimensional contour, in an additional step the metal coating is deposited by means of a PVD method at least onto the luminous area defined by the mask, and in one or more further optional steps the cap member is coated on the side facing the operator and/or on the side facing the light source with a transparent or translucent protective paint.

11. The method according to claim 10, wherein the cap member and the opaque layer are produced by a multicomponent injection molding method or by in-mold lamination of an opaque film in a common step, or alternatively the opaque layer is deposited on the cap member by printing in a step following the production of the cap member.

12. The cap for a display and/or control element according to claim 1, wherein said light-transmissive metal coating is deposited by a PVD method.

13. The cap for a display and/or control element according to claim 6, wherein the entire cap member is designed to be transparent or translucent.

14. A motor vehicle comprising the display and/or control element according to claim 9.

15. The cap for a display and/or control element according to claim 1, wherein the opaque layer is paint or plastic.

* * * * *